US012690226B2

(12) United States Patent

Mun

(10) Patent No.: US 12,690,226 B2

(45) Date of Patent: Jul. 21, 2026

(54) METAL-OXIDE SEMICONDUCTOR TRANSISTORS

(71) Applicant: GlobalFoundries Singapore Pte. Ltd., Singapore (SG)

(72) Inventor: Bong Woong Mun, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 509 days.

(21) Appl. No.: 18/217,740

(22) Filed: Jul. 3, 2023

(65) Prior Publication Data

US 2025/0015181 A1     Jan. 9, 2025

(51) Int. Cl.

| | |
|---|---|
| *H01L 29/78* | (2006.01) |
| *H10D 30/01* | (2025.01) |
| *H10D 30/65* | (2025.01) |
| *H10D 62/10* | (2025.01) |
| *H10D 64/00* | (2025.01) |

(52) U.S. Cl.
CPC ....... *H10D 30/655* (2025.01); *H10D 30/0285* (2025.01); *H10D 62/102* (2025.01); *H10D 62/116* (2025.01); *H10D 64/111* (2025.01)

(58) Field of Classification Search
CPC .. H10D 30/655; H10D 62/116; H10D 62/102; H10D 64/111; H10D 30/0285
See application file for complete search history.

(56) References Cited

U.S. PATENT DOCUMENTS

| | | | |
|---|---|---|---|
| 10,211,146 B2 | 2/2019 | He et al. | |
| 10,461,152 B2 | 10/2019 | Stamper et al. | |
| 10,629,727 B2 | 4/2020 | Birner et al. | |
| 12,191,351 B1 * | 1/2025 | Mun .................... | H10D 30/668 |
| 2013/0277741 A1 | 10/2013 | Guowei et al. | |
| 2020/0083335 A1 * | 3/2020 | Leomant .............. | H10D 64/117 |
| 2022/0059665 A1 * | 2/2022 | Mun ................... | H10D 62/127 |
| 2022/0336658 A1 * | 10/2022 | Cho ..................... | H10D 84/038 |
| 2023/0130955 A1 * | 4/2023 | Lin ......................... | H10D 30/65 |
| | | | 257/343 |
| 2024/0071912 A1 * | 2/2024 | Scalia ................. | H01L 23/5256 |

FOREIGN PATENT DOCUMENTS

CN       112397591     2/2021

* cited by examiner

*Primary Examiner* — William C Trapanese

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to metal-oxide semiconductor transistors and methods of manufacture. The structure includes: a substrate comprising a drift region and a body region; a gate structure between the drift region and the body region; an insulator material over the gate structure, the drift region and the body region; and an air gap within the insulator material and extending into the drift region.

18 Claims, 6 Drawing Sheets

METAL-OXIDE SEMICONDUCTOR TRANSISTORS

BACKGROUND

The present disclosure relates to semiconductor structures and, more particularly, to metal-oxide semiconductor transistors and methods of manufacture.

A metal-oxide semiconductor field-effect transistor (MOSFET) is a type of field-effect transistor (FET). The MOSFET has an insulated gate, the voltage of which determines the conductivity of the device. This ability to change conductivity with the amount of applied voltage can be used for amplifying or switching electronic signals. In these devices, for example, Ron x gate charge (Qg) vs. breakdown voltage (BV) is a key parameter for switch loss control. And reducing Qg while maintaining BV is a key performance for advanced node high voltage applications.

An advantage of a MOSFET is that it requires almost no input current to control the load current, when compared with bipolar transistors. In an enhancement mode MOSFET, voltage applied to the gate terminal increases the conductivity of the device. In a depletion mode MOSFET, voltage applied at the gate reduces the conductivity.

The MOSFET is a common transistor in digital circuits. Since MOSFETs can be made with either p-type or n-type semiconductors, complementary pairs of MOS transistors can be used to make switching circuits with very low power consumption, in the form of CMOS logic.

SUMMARY

In an aspect of the disclosure, a structure comprises: a substrate comprising a drift region and a body region; a gate structure between the drift region and the body region; an insulator material over the gate structure, the drift region and the body region; and an air gap within the insulator material and extending into the drift region.

In an aspect of the disclosure, a structure comprises: a substrate comprising a drift region and a body region; a gate structure between the drift region and the body region; and a field plate extending from the body region, over the gate structure and towards the drift region.

In an aspect of the disclosure, a method comprises: forming a substrate comprising a drift region and a body region; forming a gate structure between the drift region and the body region; forming an insulator material over the gate structure, the drift region and the body region; and forming an air gap within the insulator material and extending into the body region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to metal-oxide semiconductor transistors and methods of manufacture. More specifically, in embodiments, the metal-oxide semiconductor transistors may be a lateral extended drain metal-oxide semiconductor (EDMOS) field effect transistor (FET) or a laterally-diffused metal-oxide semiconductor (LDMOS) FET. In either embodiment, the MOSFET may include an air gap (e.g., cavity) extending into a drift implant region (e.g., drain region), with a metal structure (e.g., field plate) adjacent to or over the air gap. In the LDMOS, a shallow trench isolation structure may be provided in the drift implant region, with the air gap extending into the shallow trench isolation structure. Advantageously, the present disclosure provides reduced parasitic capacitance and improved (e.g., increased) breakdown voltage (BV).

In more specific embodiments, an LDMOS includes a gate structure between a source region and a drain region. A shallow trench isolation region may be provided within the substrate on a drain side of the device, e.g., adjacent to the gate structure and within the drain region. The gate structure may partially overlap the shallow trench isolation region. An air gap (e.g., cavity) may be provided adjacent to the gate structure, extending into the shallow trench isolation region. A field plate may be provided over or adjacent to the air gap. In an EDMOS device, the air gap may be provided within the drift implant region (e.g., drain region), which would be devoid of the shallow trench isolation region.

The transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the transistors of the present disclosure have been adopted from integrated circuit (IC) technology. For example, the structures are built on wafers and are realized in films of material patterned by photolithographic processes on the top of a wafer. In particular, the fabrication of the transistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
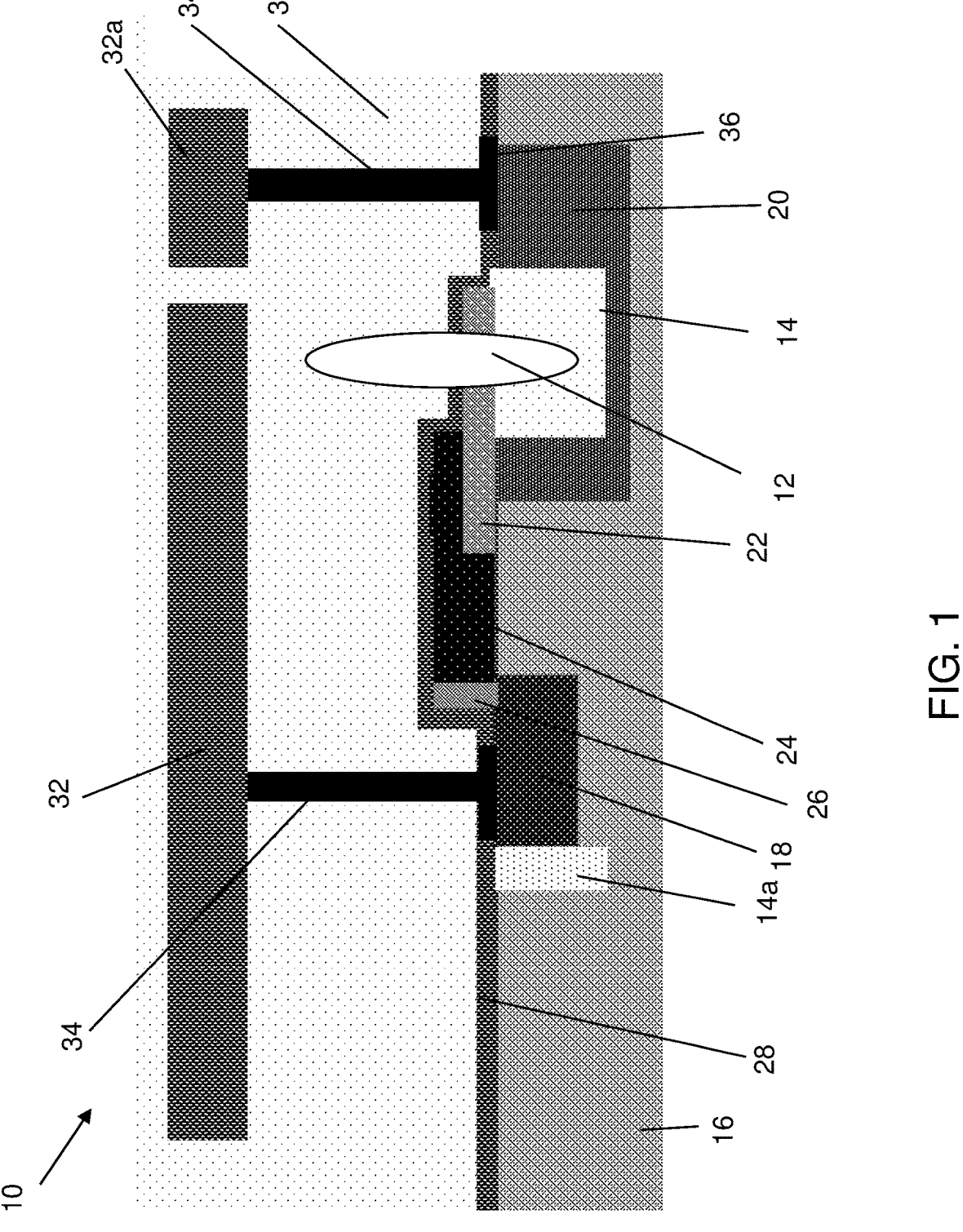
FIG. 1 shows a structure and respective fabrication processes in accordance with aspects of the present disclosure.

FIG. 1 shows a structure and respective fabrication processes in accordance with aspects of the present disclosure. In particular, the structure 10 may be an LDMOS which includes an air gap 12, e.g., cavity, extending into a shallow trench isolation structure 14 on a drain side of the device. More specifically, the structure 10 includes a semiconductor substrate 16 comprising a body implant 18 and a drift implant 20. The semiconductor substrate 16 may be composed of any suitable material including, but not limited to, Si, SiGe, SiGeC, SiC, alloys, GaAs, InAs, InP, and other III/V or II/VI compound semiconductors. In embodiments, the semiconductor substrate 16 may comprise any suitable crystallographic orientation (e.g., a (100), (110), (111), or (001) crystallographic orientation).

In embodiments, the semiconductor substrate 16 may be representative of a Bulk substrate or semiconductor on insulator (SOI) technology as is known in the art. The SOI technology includes, from bottom to top, a handle substrate, a buried insulator layer and a top semiconductor layer. The handle substrate may include a semiconductor material such as, for example, Si, SiGe, SiGeC, SiC, alloys, GaAs, InAs, InP, and other III/V or II/VI compound semiconductors. The handle substrate provides mechanical support to the buried insulator layer and the top semiconductor layer. The buried insulator layer may include a dielectric material such as silicon dioxide, silicon nitride, silicon oxynitride, boron nitride or a combination thereof. In embodiments, the buried insulator layer may be formed by a deposition process, such as chemical vapor deposition (CVD), plasma enhanced chemical vapor deposition CVD (PECVD), physical vapor deposition (PVD), a thermal growth process, or by implanting oxygen atoms into a bulk semiconductor substrate and thereafter annealing the structure. The top semiconductor layer may include any semiconductor material as mentioned above. The top semiconductor layer can be formed by a deposition process, such as CVD or PECVD. Alternatively, the top semiconductor layer may be formed using a smart cut process where two semiconductor wafers are bonded together with an insulator in between.

Still referring to FIG. 1, the body implant 18 (e.g., source region) and the drift implant 20 (e.g., extended drain region) may be provided in the semiconductor substrate 16. In embodiments, the drift implant 20 extends further away from the gate structure than the body implant 18. The body implant 18 and the drift implant 20 may be formed by an ion implantation process as described in more detail with respect to FIG. 4A. For an NMOS, the body implant 18 would be a p-type implant; whereas for a PMOS, the body implant 18 would be an n-type implant. For an NMOS, the drift implant 20 would be a high voltage deep N-well implant; whereas for a PMOS, the drift implant 20 would be a high-voltage deep P-well implant.

FIG. 1 further shows shallow trench isolation structures 14, 14a in the semiconductor substrate 16. The shallow trench isolation structure 14 may be provided in drift implant 20, e.g., the drain region, under a dielectric material 22, e.g., oxide layer. The shallow trench isolation structure 14a may be provided on a source side of the semiconductor substrate 16, adjacent to the body implant 18 (e.g., source region). In embodiments, the shallow trench isolation structure 14a may be provided on an outer edge of the body implant 18 in order to electrically isolate the body implant 18. The shallow trench isolation structures 14, 14a can be formed by conventional lithography, etching and deposition methods known to those of skill in the art as described in more detail with respect to FIG. 4A.

FIG. 1 further shows a dielectric layer 22 formed partly over the shallow trench isolation structure 14 and the drift implant 20. In embodiments, the dielectric layer 22 may be an oxide layer. A gate structure 24 is formed partly over the dielectric layer 22 and the drift implant 20. In embodiments, the dielectric layer 22 may be deposited by a conventional hot temperature oxide deposition process, followed by a conventional patterning process, e.g., lithography and etching process. The gate structure 24 may comprise a gate electrode comprising polysilicon material deposited by a chemical vapor deposition (CVD) process, followed by a conventional patterning process, e.g., lithography and etching process.

A sidewall spacer 26 may be provided on a sidewall of the gate structure 24. In embodiments, the sidewall spacer 26 may comprise nitride and/or oxide material. The sidewall spacer 26 may be formed by a conventional deposition process, e.g., CVD, followed by an anisotropic etching process as is known in the art such that no further explanation is required for a complete understanding of the present disclosure.

An etch stop layer 28 may be provided over the dielectric layer 22, gate structure 24, sidewall spacer 26, body implant 18 and drift implant 20. In embodiments, the etch stop layer 28 may be a nitride material, deposited by a conventional deposition process, e.g., CVD. An interlevel dielectric material 30 (e.g., middle-of-line (MOL) insulator material) may be formed over the etch stop layer 28. The interlevel dielectric material 30 may be an oxide material or alternating layers of, e.g., oxide material and nitride material.

The air gap 12 may be provided in the interlevel dielectric material 30, through the etch stop layer 28, dielectric layer 22 (e.g., in the LDMOS extended area) and extending within the shallow trench isolation structure 14 within the drift implant 20. In this way, the air gap 12 may be provided between the gate structure 24 and the drain region. In embodiments, the air gap 12 will reduce the parasitic capacitance of the device.

A metal structure 32 (e.g., (e.g., field plate) may be provided adjacent to and, preferably, overlapping with the air gap 12. For example, in embodiments, the metal structure 32 may be connected to the source side of the device, e.g., body implant 18, by a via interconnect structure 34, and extends toward the drain side (e.g., drift implant 20). It is contemplated by the present disclosure that the metal structure 32 may extend over the air gap 12 or adjacent to the air gap 12, e.g., on a side of the air gap 12, at different distances from the air gap 12 depending on the desired performance characteristics of the device. The metal structure 32 may comprise any known metal material, e.g., wiring structure, such as copper, tungsten, etc. In embodiments, the metal structure 32 may help deplete the drift region, reduce surface electric field and increase the breakdown voltage (BV) of the device.

Another metal structure 32a may be provided electrically to the drift implant 20 (e.g., drain side of the device) through the use of a via interconnect structure 34. The metal structure 32a may be formed in the same manner and with the same materials as the metal structure 32. A silicide contact 36 may be provided between the body implant 18 and the via interconnect structure 34 and between the drift implant 20 and the via interconnect structure 34.

Figure 2:
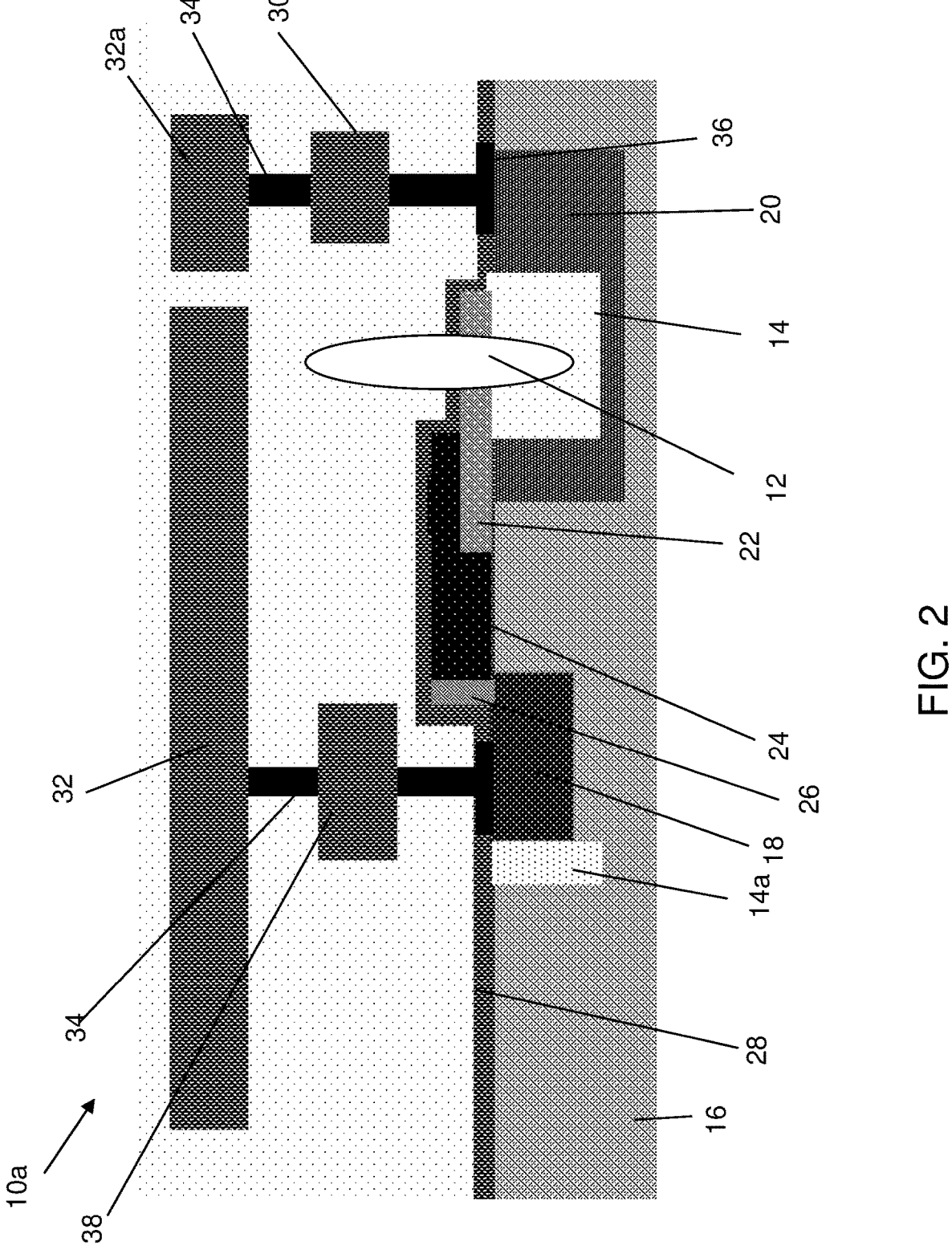
FIG. 2 shows a structure in accordance with further aspects of the present disclosure.

FIG. 2 shows a structure in accordance with further aspects of the present disclosure. In particular, the structure 10a may be an LDMOS which includes wiring structures 32a, 32 and 38 on different wiring levels. In embodiments, for example, the wiring structures 32a, 32 may be provided on an upper layer, M2 level; whereas the wiring structure 38 may be provided on a lower wiring layer, M1 level. In embodiments, the wiring structure 32 may be provided coincident with the air gap 12; that is, the wiring structure 38, if extended, would intersect with the air gap 12. The wiring structures 32a, 32 on the upper wiring level, M2, may be similar to the wiring structures (in structure, position, etc.) as described herein with respect to the structure 10 of FIG. 1 or structure 10a of FIG. 2.

It should also be recognized by one of skill in the art that the structure 10b shown in FIG. 2 may be implemented in either an LDMOS (with the shallow trench isolation structure 14) of FIG. 1 or an EDMOS (without the shallow trench isolation structure 14) of FIG. 2. The remaining features of the structure 10b of FIG. 2 are similar to the structure 10 of FIG. 1 such that no further explanation is required for a complete understanding of the present disclosure. In addition, the structure 10*a* may be manufactured in a similar manner as described with respect to FIG. 1 and FIGS. 4A-4C.

Figure 3:
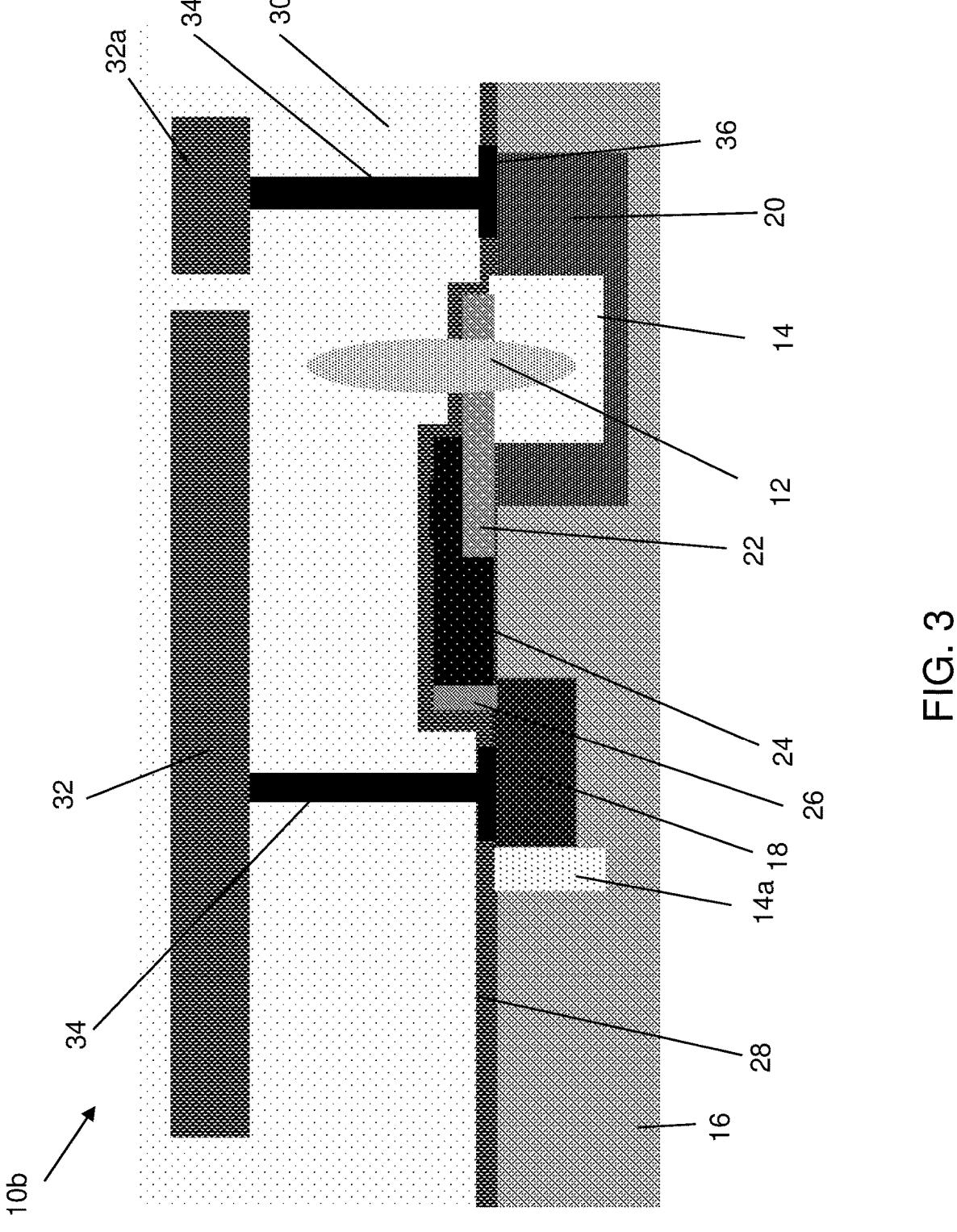
FIG. 3 shows a structure in accordance with additional aspects of the present disclosure.

FIG. 3 shows a structure in accordance with additional aspects of the present disclosure. In particular, the structure 10*b* may include the air gap 12 of FIG. 1 filled with an insulator material. For example, the air gap 12 may be filled with an oxide material. The oxide material, for example, would extend in the drift implant 20 and, more specifically, into the shallow trench isolation structure 14 within the drift implant 20. The oxide material would also extend through the through the dielectric layer 22 and the etch stop layer 28. The remaining features of the structure 10*b* may be similar to that of the structure 10 of FIG. 1 or the structure 10*a* of FIG. 2 (e.g., multiple wiring layers).

Figure 4A:
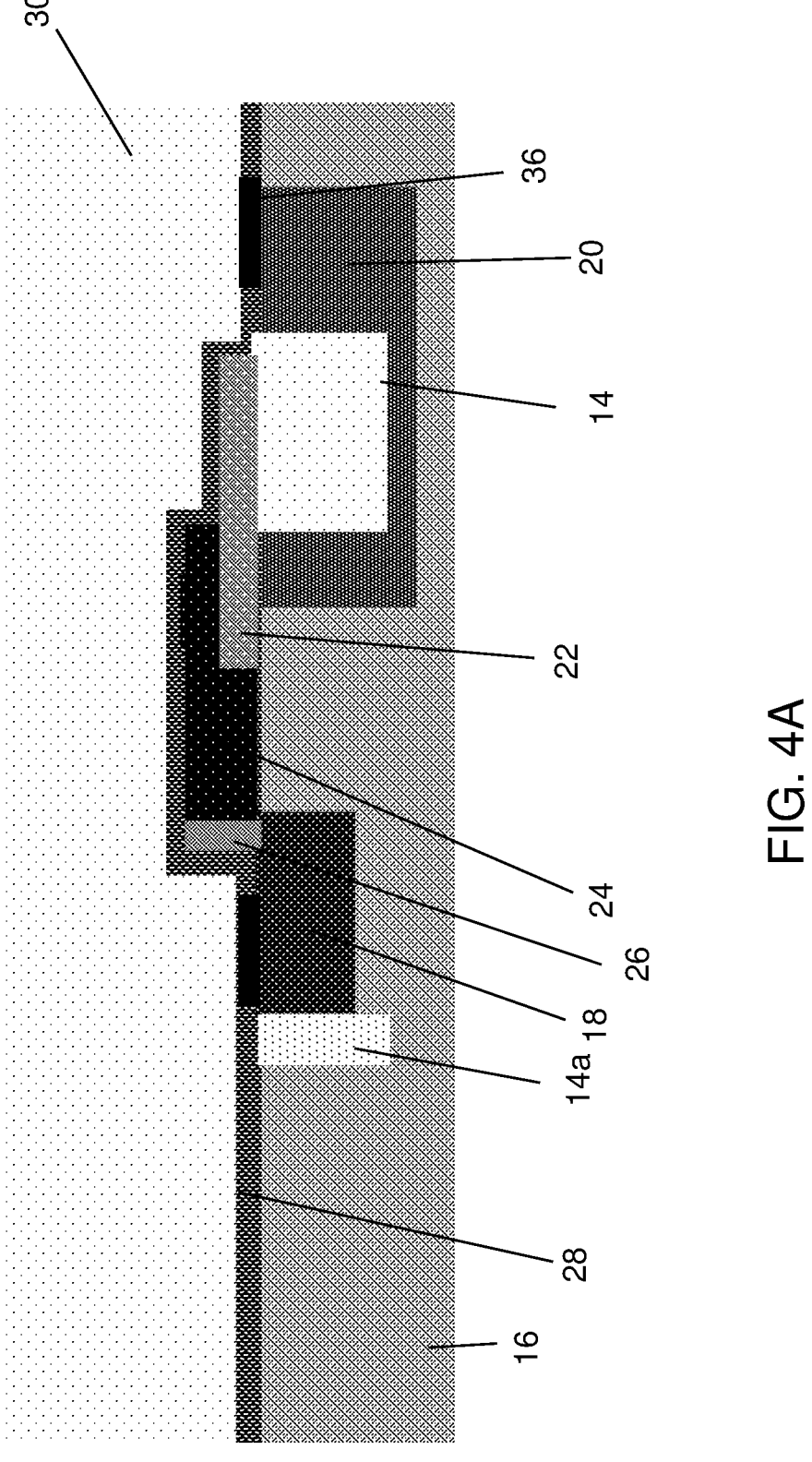
FIGS. 4A-4C show fabrication processes to manufacture the structure of FIG. 1 in accordance with aspects of the present disclosure.
Figure 4B:
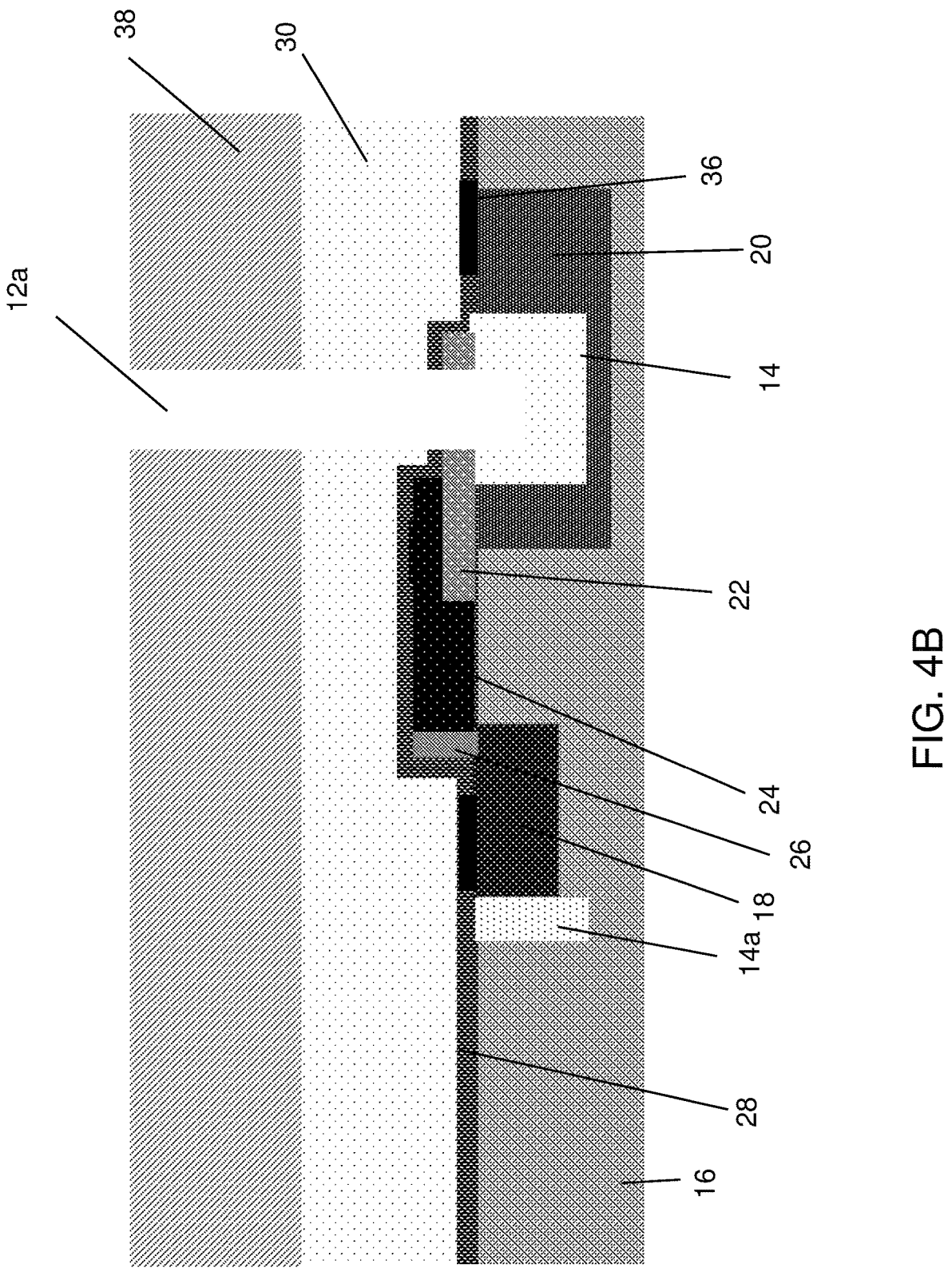
Figure 4C:
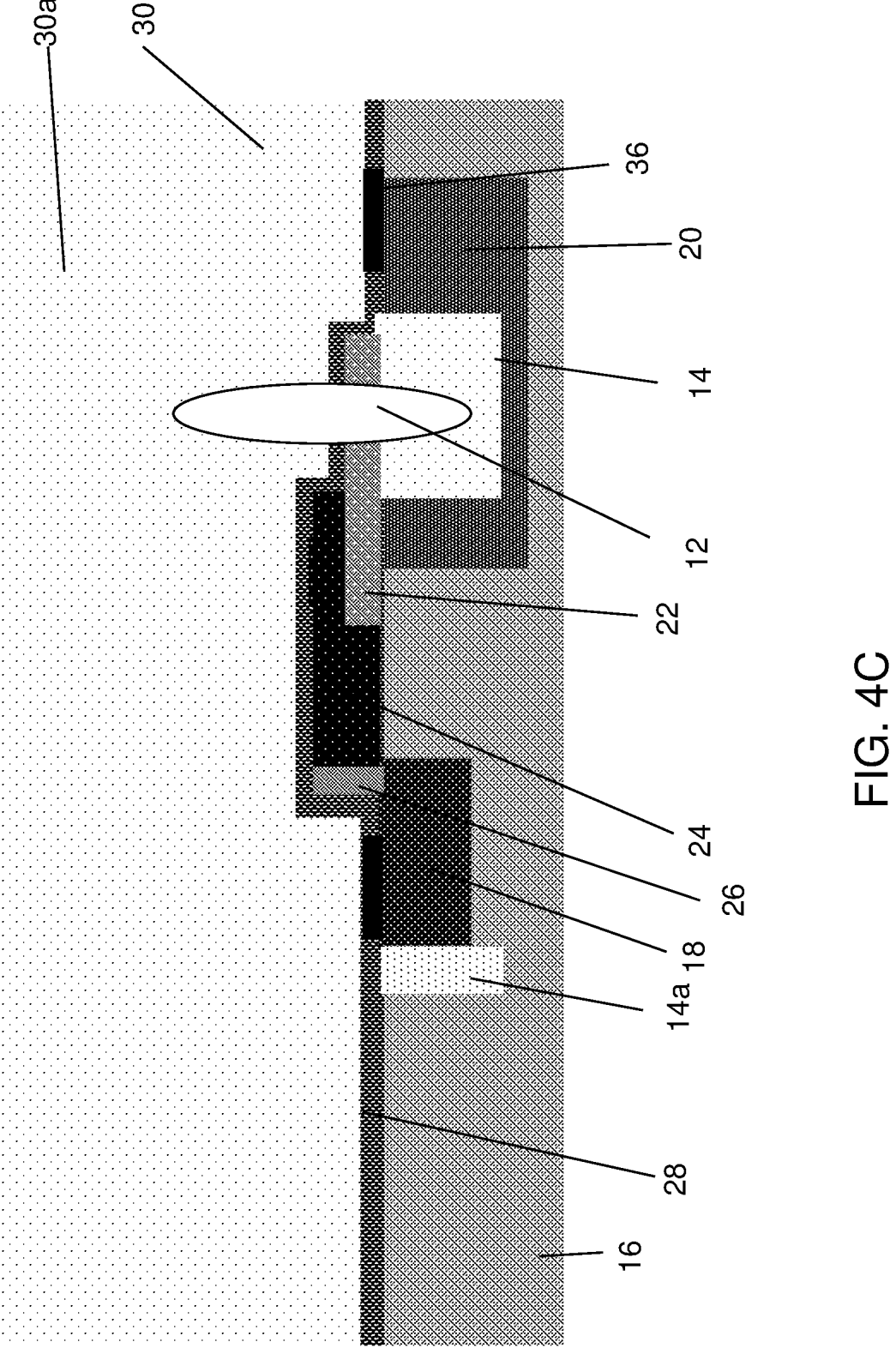

FIGS. 4A-4C show fabrication processes to manufacture the structure of FIG. 1 in accordance with aspects of the present disclosure. It should be understood by those of skill in the art that similar fabrication processes may be used to manufacture the structures 10*a* of FIG. 2.

Referring now to FIG. 4A, the body implant 18 and drift implant 20 are formed in the semiconductor substrate 16 by, for example, an ion implantation process. By way of specific example, the body implant 18 and the drift implant 20 may be formed by introducing a concentration of a different dopant of opposite conductivity type in the semiconductor substrate 16. In embodiments, respective patterned implantation masks may be used to define selected areas exposed for the implantations. The implantation mask used to select the exposed area for forming the body implant 18 is stripped after implantation, and before the implantation mask used to form the drift implant 20 or vice versa. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The p-type dopants may be, e.g., Boron (B), and n-type dopants may be, e.g., Arsenic (As), Phosphorus (P) and Sb, among other suitable examples. The dopants may be driven into the semiconductor substrate 16 by an annealing process as is known in the art.

FIG. 4A further shows the shallow trench isolation structures 14, 14*a* in the semiconductor substrate 16. The shallow trench isolation structure 14 may be provided in the drift implant 20, e.g., the drain region, under the dielectric layer 22, and the shallow trench isolation structure 14*a* may be provided on a source side of the semiconductor substrate 16, adjacent to the body implant 18 (e.g., source region).

The shallow trench isolation structures 14, 14*a* can be formed by conventional lithography, etching and deposition methods known to those of skill in the art. For example, a resist formed over the semiconductor substrate 16 is exposed to energy (light) and developed utilizing a conventional resist developer to form a pattern (opening). An etching process with a selective chemistry, e.g., reactive ion etching (RIE), will be used to transfer the pattern from the patterned resist layer to the semiconductor substrate 16 to form one or more trenches in the semiconductor substrate 16 through the openings of the resist. Following the resist removal by a conventional oxygen ashing process or other known stripants, an insulator material, e.g., $SiO_2$, can be deposited by any conventional deposition processes, e.g., chemical vapor deposition (CVD) processes. Any residual material on the surface of the semiconductor substrate 16 can be removed by conventional chemical mechanical polishing (CMP) processes.

The dielectric layer 22 and gate structure 24 may be deposited by conventional deposition processes as described with respect to FIG. 1, followed by a conventional patterning process, e.g., lithography and etching process. The sidewall spacer 26 may be provided on a sidewall of the gate structure 24 as already described with respect to FIG. 1. The etch stop layer 28 and interlevel dielectric material 30 may be provided by a conventional deposition process, e.g., CVD.

In FIG. 4B, a trench 12*a* is formed through the interlevel dielectric material 30, etch strop layer 28 and dielectric layer 22, extending into the shallow trench isolation structure 14 in the drift implant 20. In an EDMOS implementation, the trench 12*a* would be formed directly in the drift implant 20, as the shallow trench isolation structure 14 would be eliminated. The trench 12*a* can be formed by a conventional lithography and etching process using, for example, a patterned resist 38. As an example, the trench would initially be formed through the interlevel dielectric material 30 and stopping at the etch strop layer 28. Thereafter, a selective etch (e.g., RIE) can be used to etch the dielectric layer 22 and the shallow trench isolation structure 14 in the drift implant 20.

In FIG. 4C, the air gap 12 may be formed within the interlevel dielectric material 30 and in the shallow trench isolation structure 14 (or the drift implant 20 without the shallow trench isolation structure 14). In embodiments, the air gap 12 may be formed by a pinch-off process by deposition of additional interlevel dielectric material 30*a* over the interlevel dielectric material 30. The deposition of the interlevel dielectric material 30*a* would occur after the stripping of the patterned resist 38 shown in FIG. 4B. The interlevel dielectric material 30*a* may be planarized using a conventional chemical mechanical polishing (CMP) process, followed by the deposition of the metal structures on a lower metal level of the structure, as an example.

Referring back to FIG. 1, the metal structures (e.g., field plates) 32*a*, 32*a* and via interconnect structures 34 may be formed by conventional single or dual damascene processes, e.g., lithography, etching (e.g., RIE) and deposition process. For example, trenches may be formed into the interlevel dielectric material 30 (and 30*a*) by a conventional lithography and etching process to expose portions of the body implant 18 on the source side and the drift implant 20 on the drain side.

Prior to the deposition of metal material for the via interconnect structures 34, a silicide process may be performed to form the silicide contacts 36. As should be understood by those of skill in the art, the silicide process begins with deposition of a thin transition metal layer, e.g., nickel, cobalt or titanium, over fully formed and patterned semiconductor devices (e.g., doped or ion implanted source and drain regions (exposed portions of the body implant 18 and the drift implant 20)). After deposition of the material, the structure is heated allowing the transition metal to react with exposed silicon (or other semiconductor material as described herein) forming a low-resistance transition metal silicide.

Following the reaction, any remaining transition metal is removed by chemical etching, leaving silicide contacts 36. Thereafter, the metal structures 32*a*, 32 and via interconnect structures 34 may be formed by known deposition processes, e.g., CVD. In embodiments, using a single damascene process, an additional trench would be etched for the metal structures 32*a*, 32. The trench for the metal structure 32 may extend over the air gap 12 or adjacent to the air gap 12 such that the location and overlap of the metal structure 32 can be adjusted with respect to the air gap 12.

The transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate comprising a drift region and a body region;
   a gate structure between the drift region and the body region;
   an insulator material over the gate structure, the drift region and the body region; and
   an air gap within the insulator material and extending into the drift region,
   wherein the air gap extends through a dielectric layer partially under a gate electrode of the gate structure.

2. The structure of claim 1, wherein the dielectric layer comprises oxide material.

3. The structure of claim 2, wherein the drift region comprises an extended drain region and the body region comprises a source region.

4. The structure of claim 1, further comprising a field plate extending from the body region, over the gate structure and adjacent to the air gap.

5. The structure of claim 4, wherein the field plate extends over the air gap.

6. The structure of claim 5, wherein the field plate is provided on an upper metallization layer.

7. The structure of claim 1, further comprising a shallow trench isolation structure within the drift region.

8. The structure of claim 7, wherein the air gap extends partially into the shallow trench isolation structure.

9. The structure of claim 8, further comprising a field plate extending from the body region, over the gate structure and adjacent to the air gap.

10. The structure of claim 9, wherein the field plate extends over the air gap.

11. A structure comprising:
    a substrate comprising a drift region and a body region;
    a gate structure between the drift region and the body region;
    a field plate extending from the body region, over the gate structure and towards the drift region; and
    an air gap extending into the body region.

12. The structure of claim 11, wherein the drift region comprises an extended drain region and the body region comprises a source region.

13. The structure of claim 11, wherein the field plate extends over the air gap.

14. The structure of claim 11, wherein the field plate extends adjacent to the air gap.

15. The structure of claim 11, wherein the field plate is on an upper metallization layer, with a lower metallization layer coincident with the air gap.

16. The structure of claim 11, further comprising a shallow trench isolation structure within the drift region, and the air gap extends partially into the shallow trench isolation structure.

17. The structure of claim 16, wherein the field plate extends over the air gap.

18. A method comprising:
    forming a substrate comprising a drift region and a body region;
    forming a gate structure between the drift region and the body region; forming an insulator material over the gate structure, the drift region and the body region; and
    forming an air gap within the insulator material and extending into the body region, wherein the air gap extends through a dielectric layer partially under a gate electrode of the gate structure.

* * * * *